United States Patent [19]

Kukanskis et al.

[11] Patent Number: 5,547,559
[45] Date of Patent: Aug. 20, 1996

[54] PROCESS FOR PLATING METALS ONTO VARIOUS SUBSTRATES IN AN ADHERENT FASHION

[75] Inventors: Peter Kukanskis, Woodbury; Ernest Yakobson; Lev Taytsas, both of Waterbury, all of Conn.

[73] Assignee: MacDermid, Incorporated, Waterbury, Conn.

[21] Appl. No.: 499,835

[22] Filed: Jul. 10, 1995

[51] Int. Cl.$^6$ .............. C25D 5/02; C25D 5/56; C25D 5/34; C23C 28/02

[52] U.S. Cl. .......... 205/125; 205/126; 205/164; 205/167; 205/169; 205/187; 205/205; 205/210; 205/219

[58] Field of Search .................. 205/125, 126, 205/162, 163, 164, 167, 169, 187, 205, 210, 219

[56] References Cited

U.S. PATENT DOCUMENTS

| | | | |
|---|---|---|---|
| 2,606,866 | 8/1952 | Neish | 205/219 |
| 2,699,425 | 1/1955 | Nieter | 205/126 |
| 3,099,608 | 7/1963 | Radovsky et al. | 204/15 |
| 3,819,497 | 6/1974 | Grunwell et al. | 204/15 |
| 4,270,986 | 6/1981 | Smith | 205/219 |
| 4,279,948 | 7/1981 | Kukanskis et al. | 427/305 |
| 4,608,275 | 8/1986 | KuKanskis et al. | 427/98 |
| 4,756,930 | 7/1988 | Kukanskis et al. | 427/97 |
| 4,863,758 | 9/1989 | Rhodenizer | 427/97 |
| 4,891,069 | 1/1990 | Holtzman et al. | 205/125 |
| 4,952,286 | 8/1990 | Bladon et al. | 205/187 |
| 4,976,990 | 12/1990 | Bach et al. | 427/98 |
| 5,238,550 | 8/1993 | Burress | 205/167 |
| 5,262,041 | 11/1993 | Gulla | 205/125 |
| 5,342,501 | 8/1994 | Okabayashi | 205/159 |

*Primary Examiner*—Kathryn Gorgos
*Assistant Examiner*—Edna Wong
*Attorney, Agent, or Firm*—John L. Cordani

[57] ABSTRACT

The invention described provides a process for direct electroplating on activated surfaces substantially without the formation of a smut layer and thereby improving the adhesion of the plated deposit to the surface. The use of divalent or tetravalent sulfur compounds and/or cathodic electrocleaning is proposed between activation of the surface and electroplating of the surface.

13 Claims, No Drawings

PROCESS FOR PLATING METALS ONTO VARIOUS SUBSTRATES IN AN ADHERENT FASHION

FIELD OF INVENTION

The present invention relates to a process for plating metals onto surfaces which have been catalyzed with a precious metal activator to accept plating thereupon, such that the plated metal deposit firmly adheres to the substrate surface. The method is particularly suitable for plating upon substrates which have been activated with Palladium/Tin activator solutions.

BACKGROUND OF THE INVENTION

In general the metal plating of plastics and other nonconductive substrates is well known. The preparation of printed circuit boards requires the plating of conductive metal layers, usually copper, onto the plastic/metal composite structure of the board. Printed circuit boards vary in design and may only have a copper layer on each surface of the epoxy (two-sided boards) or they can be multi-layer boards which have a plurality of interleaved parallel planar copper and epoxy layers. In both types, through-holes are drilled in the board and metal plated to facilitate connection between the layers and/or the exterior surfaces.

For the most part these through-hole connections are made by utilizing an electroless metal plating cycle which consists of a sequence of steps. In this sequence the through-holes are first treated to clean and condition the surfaces of the board. This cleaning and conditioning sequence can be as simple as one process step followed by a rinse or as complicated as a full etch back or desmear cycle involving a long series of process steps and appropriate rinsing. For a further description see U.S. Pat. No. 4,756,930, the teachings of which are incorporated herein by reference in their entirety.

Following cleaning and conditioning, the surfaces are then normally subjected to activation. For electroless metallization processes, activation normally consists of contacting the boards with a pre-activator followed by a palladium-tin colloidal activator solution. For a further description see U.S. Pat. No. 4,863,758, the teachings of which are incorporated herein by reference in their entirety. The activated surfaces are then optionally subjected to an accelerator. For a discussion of accelerators, their composition and uses see U.S. Pat. No. 4,608,275, the teachings of which are incorporated herein by reference in their entirety.

Finally, the surfaces are plated in the electroless plating solution in order to deposit conductive metal, usually copper, onto the non-conductive surfaces of the board in order to make the electrical connections necessary. For a discussion of the electroless plating cycle as a whole and the electroless plating solution itself, see U.S. Pat. No. 4,976,990, the teachings of which are incorporated herein by reference in their entirety.

The preceding procedure, however, can be time consuming, costly, relatively inefficient and troubling from environmental and safety perspectives. These shortcomings have prompted industry to develop various processes to replace the conventional electroless copper process. Among these replacement processes are a variety of processes generically known as direct plate processes. Direct plate processes have at least one common attribute in that direct plate processes plate metal onto non-conductive surfaces without the use of typical electroless copper baths.

U.S. Pat. No. 3,099,608 (Radovsky, et. al.), the teachings of which are incorporated herein in their entirety, discusses an attempt to avoid the need for an electroless plating step by directly electroplating metal onto a thin layer of colloidal palladium. This palladium film was deposited onto the substrate surface utilizing a palladium-tin catalyst solution such as is described in U.S. Pat. No. 4,863,758, the teachings of which are incorporated herein by reference in their entirety.

Many improvements have subsequently been made to the basic process described in Radovsky, et al. al. One such improvement is described in Morrissey, et.al. (G.B. Pat. No. 123,0 - 36A) wherein particular electroplating bath additives are used to enhance the electroplating on the palladium (activator) film. In addition see Okabayashi (U.S. Pat. No. 5,342,501 ), the teachings of which are incorporated herein by reference in their entirety, wherein basic accelerating solutions are applied after palladium activation to increase the activity of the palladium film towards electroplating and thereby to improve the film's electroplatability.

The various direct plate processes which involve direct electroplating over a palladium film, such as the processes described in Radovsky et al., Morrisey et al. and Okabayashi, have some drawbacks or problems. One major problem is the formation of a smut on the activated surface during the initial stages of electroplating. When these palladium based direct electroplating processes are utilized, a smut forms on the activated surfaces (ie. the surfaces to be plated which have been activated with palladium or palladium-tin colloidal solutions) during the initial stages of electroplating. The smut appears as a brown or black deposit on the surface after a short time in the electroplating bath. The smut is then subsequently overplated with the electroplated metal (usually copper). However the smut may and often does cause adhesion failures between the electroplated metal and the surface being plated particularly copper to copper adhesion, and in printed circuits interconnect defects. In addition this smut may interfere with electroplating in other ways, such as decreased efficiency, poor deposit integrity and other similar problems.

Thus it is an object of this invention to provide a process for direct electroplating on palladium, palladium-tin or similarly activated surfaces substantially without the formation of smut.

It is a further object of this invention to provide a process for direct electroplating on palladium, palladium-tin or similarly activated surfaces, which process provides improved adhesion of the plated metals to the substrate surfaces.

Finally it is an object of this invention to provide a process for direct electroplating on palladium, palladium-tin, or similarly activated surfaces which process provides improved plating efficiency and deposit integrity.

SUMMARY OF THE INVENTION

Generally stated, the present invention accomplishes the above described objectives by providing for a pretreatment step prior to electroplating. The present invention therefore proposes treating the surface to be directly electroplated with a solution containing a divalent or tetravalent sulfur compound after activation (and after acceleration, if used) but before direct electroplating.

It has been found that the simple pretreatment proposed by this invention substantially eliminates smut formation in the electroplating operation thereby improving adhesion of the plated metal to the surface, and electroplated deposit integrity. The process of the current invention is particularly useful in the direct electroplating of printed circuit boards.

DETAILED DESCRIPTION OF THE INVENTION

The present invention proposes a process which involves treating the surface to be directly electroplated with a solution comprising a divalent or tetravalent sulfur compound after the surface has already been appropriately activated (and after acceleration, if used) but before electroplating. A sample process sequence for directly electroplating non-conductive surface with the process of this invention may be as follows:

1. Clean and condition the surfaces of the substrate to be plated;
2. Optionally micro etch any metallic surfaces on the substrate to be plated;
3. Activate the surfaces of the substrate;
4. Optionally accelerate the activated surfaces;
5. Optionally electrolessly plate the surface;
6. Treat the surfaces with the process of the current invention. (ie. treat the activated surfaces with a solution comprising a divalent or tetravalent sulfur compound;
7. Optionally treat the surfaces with an acid predip;
8. Electroplate.

The cleaning and conditioning of the surfaces of the substrate can be accomplished with a variety of cleaner/conditioners known in the art. For a particularly useful cleaning and conditioning cycle see U.S. Pat. No. 4,976,990 the teachings of which are incorporated herein by reference in their entirety. As part of the cleaning/conditioning cycle, it is frequently advantageous to etch the part prior to the actual cleaner/conditioner. For plastic based parts various etchants are useful such as permanganate, chromic acid, and sulfuric acid.

Following the cleaning/conditioning cycle, if the substrate has metallic surfaces, such as are found on printed circuit boards, then microetching of those metallic surfaces is frequently practiced. Microetching can be accomplished through a variety of well known techniques such as sulfuric/peroxide or persulfate based microetchants.

The activation of the surface is most frequently accomplished through the use of a palladium-tin colloidal activator solution. For a full discussion of such activation solutions please see U.S. Pat. Nos. 4,863,758 and 3,011,920, the teachings both of which are incorporated by reference herein in their entirety. In addition to palladium or palladium-tin activators, other similar precious metal or non-precious metal activators may be utilized.

Optionally, after activation the surfaces may be treated with an accelerator. If used, it is most preferable to utilize an alkaline accelerator such as those described in Okabayashi or U.S. Pat. No. 4,608,275, the teachings of which are incorporated herein by reference in their entirety.

Optionally, the surfaces may be electrolessly plated. The smutting problem may occur later in electroplating, if the process of this invention is not utilized, particularly if the electroless deposit is very thin (ie. less than about 50 microinches) or if the electroless deposit contains particular impurities or is of the type described in U.S. Pat. No. 4,279,948, the teachings of which are incorporated herein by reference. In any case the use of the method proposed herein substantially decreases or eliminates any subsequent smutting problem.

Subsequently the surfaces are treated with a solution comprising a divalent or tetravalent sulfur compound. Examples of compounds useful in this invention are sulfites, thiosulfates, thioureas, and dithionates. The treatment solution of this invention preferably comprises from 0.5 to 150 grams/liter and most preferably from 10 to 50 grams per liter of the prescribed sulfur compounds. The temperature of the treatment solution can range from 60° to 200° F. and is preferably from 75° to 100° F. The surfaces can be treated with this solution by immersion, spray, flood or similar application.

After treatment in the process of this invention the surfaces can optionally be treated in a mild acid solution prior to electroplating. Following this optional acid treatment the substrate is then electroplated. Electroplating can occur in a variety of electroplating solutions. For a discussion of useful electroplating solutions and processes please see U.S. Pat. No. 3,819,497, the teachings of which are incorporated herein by reference in their entirety. In the case of printed circuit boards, the electroplating solution will most likely be a copper electroplating solution, although other metals such as nickel may be employed.

As indicated previously when the process of the current invention is utilized, substantially no smut is formed during the initial stages of the electroplating operation. The general absence of smut formation then provides for improved adhesion of the plated metal to the substrate surfaces, and improved plated metal integrity. These improvements are particularly important when plating printed circuit boards to meet the exacting specifications therefor.

Although the mechanism for smut formation is not clearly understood it is believed that the combination of the chemical environment and the reducing potential in the electroplating bath contribute to the smut formation in the initial stages of electroplating. Without the benefit of this invention the smut forms during these initial stages and then is overplated with the deposited metal. It is felt that the process and compounds of the present invention modify the activated surface such that substantially no smut is formed. The mechanism for this modification is not clearly understood, but the benefits achieved thereby are substantial.

As an alternative to or in addition to the treatment of the surfaces in solutions comprising the sulfur compounds described herein, the inventors have discovered that cathodically electrocleaning the parts prior to electroplating also suppresses smut formation and gives enhanced adhesion, and improved deposit integrity. This cathodic electrocleaning can occur in a solution comprising sulfur compounds as described herein or in other suitable solutions. The inventors have discovered that cathodic electrocleaning itself suppresses smut formation and, if used in conjunction with the sulfur compounds described herein, provides optimum results. The temperature of the electrocleaning solution may range from 60° to 200° F., the time of treatment may range from a few seconds to several minutes and the current density of the electrocleaning operation may range from 1 to 300 A.S.F.

The following examples demonstrate the operation of the proposed invention, but should not be taken as in any way limiting.

EXAMPLE I

A copper clad epoxy/glass laminate (printed circuit board precursor) with holes drilled in it was processed through the following cycle:

1. Cleaner/Conditioner (MacDermid 9267 Cleaner/Conditioner, 120° F., $5^{min}$)*

2. Microetch (MacDermid MaCu Prep G-4 Microetch, 100° F., 1$^{min}$)*

3. Activator Predip (MacDermid 93 Pre-Dip, 75° F., 1$^{min}$)*

4. Activator (MacDermid 95 Activator, 90° F., 5$^{min}$)*

5. Accelerator (MacDermid 97 Accelerator, 120° F., 2° F.)*

6. Aqueous solution containing 100 gr/l sodium sulfite, 120° F., 5$^{min}$, pH=8.

7. 10% Sulfuric Acid, 75° F., 1$^{min}$)*

8. Copper Electroplate (MacDermid Hi Spec Acid Copper, 15 ASF, 1$^{min}$).*

*Available from MacDermid, Incorporated, 245 Freight Street, Waterbury, Conn. 06702

Note—Fresh water rinses were employed between each chemical treatment.

No smut was observed on the surface after 1 minute of electroplating. Subsequently the panel was electroplated to 1 mil thickness and examined for adhesion, particularly copper to copper adhesion. No blistering or other adhesion related defects were observed. Adhesion testing revealed that adhesion was excellent. The deposit integrity was good.

EXAMPLE II

A similar panel was run through the same cycle as in Example I, except that 20 gr/l sodium thiosulfate at a pH=7 was used instead of the sodium sulfite solution. No smut formation was observed and similarly good results were obtained.

EXAMPLE III

A similar panel was run through the same cycle as in Example I except that 1 gr/l thiourea solution at a pH=2 was employed instead of the sodium sulfite solution. No smut formation was observed and similarly good results were achieved.

EXAMPLE IV

A similar panel was run through the same cycle as in Example I except that 50 gr/l sodium dithionate solution at a pH=10 was used instead of the sodium sulfite solution. No smut formation was observed and similarly good results were achieved.

EXAMPLE V

A similar panel was run through the same cycle as in Example I, except instead of employing the sodium sulfite solution, the panel was cathodically electrocleaned in a 20 gr/l sodium sulfate solution at pH=9 for 1 minute at 20 A.S.F. and ambient temperature. No smut formation was observed and similarly good results were achieved.

EXAMPLE VI

A similar panel was run through the same cycle as in Example I, except that prior to treatment in the sodium sulfite solution, the panel was electrolessly plated in MacDermid's Phoenix electroless copper (as described in U.S. Pat. No. 4,279,948). No smut formation was observed and similarly good results were obtained.

Comparative Example I

A similar panel was run through the same cycle as in Example I, except that the sodium sulfite solution was omitted completely without replacement. Heavy dark brown smut was observed on the surface of the panel after 1 minute of electroplating. Subsequently the panel was electroplated to 1 rail thickness and examined for adhesion, particularly copper to copper adhesion. Significant blistering and peeling was observed. Adhesion testing revealed that adhesion was poor.

Comparative Example II

A similar panel was run through the same cycle as in Example VI except that the sodium sulfite treatment was not performed. Heavy dark brown smut was observed on the surface of the panel after 1 minute of electroplating. Subsequently the panel was electroplated to 1 rail thickness and examined for adhesion, particularly copper to copper adhesion. Significant blistering and peeling was observed. Adhesion testing revealed that adhesion was poor.

We claim:

1. A process for electroplating surfaces comprising:

a. activation of the surfaces;

b. cathodically electrocleaning the surfaces; and c. after treatment according to steps (a) and (b) electroplating upon the electrocleaned surfaces.

2. A process according to claim 1 wherein the process further comprises a step of cleaning and conditioning the surfaces prior to activation of the surfaces.

3. A process according to claim 2 wherein the process further comprises a step of contacting the surface with an accelerator between steps (a) and (b) thereof.

4. A process according to claim 3 wherein the activation is achieved by a colloidal palladium-tin activator solution.

5. A process according to claim 3 wherein the electrocleaning occurs in a solution comprising a compound selected from the group consisting of divalent sulfur compounds and tetravalent sulfur compounds.

6. A process according to claim 5 wherein the compound is selected from the group consisting of sulfites, thioureas, thiosulfates and dithionates.

7. A process according to claim 1 wherein the process further comprises a step of contacting the surfaces with an accelerator between steps (a) and (b) thereof.

8. A process according to claim 10 wherein the electrocleaning occurs in a solution comprising a compound selected from the group consisting of divalent sulfur compounds and tetravalent sulfur compounds.

9. A process for electroplating surfaces comprising:

a. activation of the surfaces;

b. electrolessly plating the activated surfaces;

c. treating the electrolessly plated surfaces with a solution comprising a compound selected from the group consisting of divalent sulfur compounds and tetravalent sulfur compounds; and d. after treatment according to steps. (a), (b) and (c), electroplating upon the treated surfaces.

10. A process according to claim 9 wherein the process further comprises a step of cleaning and conditioning the surfaces prior to activation of the surfaces.

11. A process according to claim 10 wherein the process further comprises a step of contacting the surfaces with an accelerator between steps (a) and (b) thereof.

12. A process according to claim 10 wherein the compound is selected from the group consisting of sulfites, thiosulfates, thioureas and dithionates.

13. A process according to claim 9 wherein the activated surfaces are electrolessly plated in a solution containing substantially no formaldehyde.

* * * * *